United States Patent [19]
Feliz

[11] Patent Number: 5,606,277
[45] Date of Patent: Feb. 25, 1997

[54] AC COUPLING LOOPS FOR CURRENT-TO-VOLTAGE TRANSIMPEDANCE AMPLIFIERS AND METHODS OF USING SAME

[75] Inventor: George F. Feliz, San Jose, Calif.

[73] Assignee: Linear Technology Corporation, Milpitas, Calif.

[21] Appl. No.: 494,237

[22] Filed: Jun. 23, 1995

[51] Int. Cl.$^6$ .............................. H03F 3/08; H03K 5/08; H01J 40/14

[52] U.S. Cl. ................. 327/311; 327/103; 327/362; 327/514; 327/553; 327/563; 330/59; 330/85; 330/294; 250/214 C; 250/214 LA

[58] Field of Search .......................... 327/560, 561, 327/103, 551, 553, 362, 309, 323, 311, 312, 514, 558, 563, 554; 330/85, 294, 104, 59, 308, 553, 103; 250/214 LA, 214 B, 214 A, 214 C, 214 R

[56] References Cited

U.S. PATENT DOCUMENTS

| | | | |
|---|---|---|---|
| 3,805,091 | 4/1974 | Colin | 330/294 |
| 4,354,162 | 10/1982 | Wright | 330/294 |
| 5,030,925 | 7/1991 | Taylor | 330/308 |
| 5,119,224 | 6/1992 | Smith | 250/214 B |
| 5,216,375 | 6/1993 | Tanigawa et al. | 327/335 |
| 5,286,969 | 2/1994 | Roberts | 330/110 |
| 5,287,340 | 2/1994 | Chapman et al. | 330/308 |
| 5,389,839 | 2/1995 | Heck | 327/553 |
| 5,396,188 | 3/1995 | Aoki | 327/552 |
| 5,444,579 | 8/1995 | Klein et al. | 330/305 |
| 5,451,902 | 9/1995 | Huang et al. | 330/253 |
| 5,455,705 | 10/1995 | Gusinov | 250/214 A |
| 5,471,665 | 11/1995 | Pace et al. | 330/259 |
| 5,498,865 | 3/1996 | Gaboury et al. | 250/214 A |

OTHER PUBLICATIONS

J. G. Graeme, G. E. Tobey & L. P. Huelsman, *Operational Amplifiers: Design and Applications*, pp. 222–223, published in 1971.

"Photodiode Monitoring with Op Amps," published in *The Handbook of Linear IC Applications*, Burr–Brown Corp., pp. 192 and 198, published 1987.

"HPSIR: Serial Infrared Communications Specification & Hardware Design Guide," published by Hewlett–Packard, pp. 1–11, published in Sep. 1993.

R. M. Stitt & W. Meinel, "Photodiode–Amp Nulls Ambient Light," *Electronic Design*, pp. 74–75, Dec. 16, 1993.

*Primary Examiner*—Timothy P. Callahan
*Assistant Examiner*—Terry L. Englund
*Attorney, Agent, or Firm*—Fish & Neave; Robert W. Morris

[57] ABSTRACT

Transimpedance amplifier circuits and methods are provided in which the break frequency of the amplifier is adjusted through a single interface point to the amplifier circuit. At frequencies below the break frequency, the amplifier circuit provides an error current which effectively nulls the output of the transimpedance amplifier so that no output is produced. At frequencies above the break frequency, the break frequency setting element is essentially a short circuit that results in the frequency dependent voltage being substantially zero. This causes the transimpedance amplifier to convert current-to-voltage without signal degradation. The circuit also enables a user to adjust the break frequency without affecting the overall operation of the amplifier. Thus, the amplifier may be coupled to different output circuits for operations in accordance with different communication standards.

22 Claims, 7 Drawing Sheets

AC COUPLING LOOPS FOR CURRENT-TO-VOLTAGE TRANSIMPEDANCE AMPLIFIERS AND METHODS OF USING SAME

BACKGROUND OF THE INVENTION

This invention relates to transimpedance amplifiers and other circuits which incorporate current-to-voltage conversion. More particularly, the present invention relates to circuits and methods for rejecting low frequency signals in current-to-voltage transimpedance amplifiers to ensure that signals from ambient sources, for example, sunlight interference with the operation of a photodiode, can be fully attenuated.

The use of photodiodes as receivers for data transmission and as sensors, is well known. In typical photodiode applications, incident light received by the photodiode is transformed into a current. The amount of current produced by the photodiode indicates the intensity of light received by the photodiode.

The output current of the photodiode is often converted into a voltage, which is amplified and compared to predetermined threshold values. The comparison may result in a decoding process which converts the varying light into a stream of data bits, such as an infrared data transmission system in an office environment. In the case where the photodiode is merely being used as a sensor, the comparison may simply indicate that a specific event has occurred (for example, that a manufactured part has passed a certain point along an assembly line).

Various difficulties may be encountered when attempting to utilize photodiodes. In particular, ambient light may interfere with the reception of light from the signal source. For example, in the office environment discussed above, several other light sources in the office may provide interfering light to the infrared system, including sunlight, incandescent lamps, and fluorescent lights. In most cases, it is desireable to filter out the ambient light from the light signal. The filtering is typically accomplished through the use of low-pass and high-pass filters. While the use of low-pass filters (to eliminate light having frequencies higher than the light signal) is relatively straightforward to implement, various difficulties occur in attempting to filter out signals at frequencies lower than the light signal.

One of the most basic solutions for a current-to-voltage converter including a low-pass filter is shown in FIG. 1. As described above for multiple photodiode configurations, it is preferable to have the current-to-voltage circuit on the same silicon chip as the photodiode to eliminate problems commonly experienced through the use of discrete components (e.g., leakage current errors and noise pickup).

The circuit of FIG. 1 includes photodiode 102 (shown schematically as current source 104 and junction capacitance 106), which receive light from at least light source 108, resistors 110 and 112, capacitor 114 and amplifier 116. Resistor 110 converts the current passing through photodiode 102 ($I_{PD}$) into a voltage which is amplified by amplifier 116 into output voltage $V_{OUT}$. The low-pass filter is the RC network formed by resistor 112 and capacitor 114, which has a cutoff frequency that is set by the values of resistor 112 and capacitor 114.

One inherent deficiency of the circuit of FIG. 1 is the low sensitivity of the circuit due to the fact that resistor 110 must have a low resistance value. The requirement for low resistance in resistor 110 occurs because resistor 110 and capacitor 106 also form a low-pass filter which, as resistor 110 is increased to improve sensitivity, may act to block out the desired signals.

One attempt at resolving these deficiencies is the replacement of amplifier 116 and resistor 112 with an operational amplifier (opamp) which performs the transimpedance function. In such a circuit a resistor and capacitor, which may be configured in a similar manner as shown by resistor 110 and capacitor 114 of FIG. 1, are used to set the high pass frequency. However, the circuit may be particularly susceptible to noise because of the conflicting requirements between the resistor and the capacitor.

For proper performance, the capacitor must be large as compared to the photodiode's capacitance, and the resistor must be large to minimize low frequency noise. However, if both elements are large, a high break frequency is simply not possible. Further, if the resistor is large and the capacitor is small, the gain of the circuit is reduced and the input referred noise is large, resulting in additional degradation of sensitivity.

Another attempt at resolving the above described deficiencies is shown in FIG. 2. In FIG. 2, the output current from the photodiode 102 is input to the inverting terminal of opamp 202, which provides the transimpedance function. The break frequency of the circuit is set by resistors 204 and 214, capacitors 206 and 216, and the ratio of resistor 208 to resistor 210. A non-inverting integrator 212 is coupled to the output of opamp 202 (through resistor 204) to force the output of opamp 202 ($V_{OUT}$) to be zero at frequencies below the break frequency. For proper operation, the product of the values of resistor 204 times capacitor 206 should substantially equal the product of the values of resistor 214 and capacitor 216.

The loop from opamp 202 to integrator 212 and back forces $V_{OUT}$ to be zero at sub-break frequencies by the current which flows through resistor 208 based on the output voltage of integrator 212. At high frequencies (i.e., above the break frequency), capacitors 206 and 216 are short-circuits which essentially turns off integrator 212. While this circuit provides output signals with relatively high sensitivity, changes to the break frequency may be difficult to accomplish because at least two elements must be changed. For example, if capacitors 206 and 216 have fixed values, resistors 204 and 214 must be adjusted to change the break frequency. Further, changing the two resistors will require access to at least three pins on the integrated circuit containing opamp 202.

In view of the foregoing, it would be desirable to provide transimpedance amplifier circuits in which the break frequency may be adjusted through the use of a single circuit element.

It would also be desirable to provide transimpedance amplifier circuits in which the break frequency may be adjusted via a single interface to the amplifier circuit.

It would be further desirable to provide transimpedance amplifier circuits which reject low frequency signals and allow high frequency signals to pass unaffected thereby providing high sensitivity.

It would be still further desirable to provide methods for adjusting the break frequency of a transimpedance amplifier circuit with minimal effects to the interface between the amplifier circuit and external circuitry.

SUMMARY OF THE INVENTION

It is therefore an object of the present invention to provide transimpedance amplifier circuits in which the break frequency may be adjusted through the use of a single circuit element.

It is also an object of the present invention to provide transimpedance amplifier circuits in which the break frequency may be adjusted via a single interface to the amplifier circuit.

It is a further object of the present invention to provide transimpedance amplifier circuits which reject low frequency signals and allow high frequency signals to pass unaffected thereby providing high sensitivity.

It is a still further object of the present invention to provide methods for adjusting the break frequency of a transimpedance amplifier circuit with minimal effects to the interface between the amplifier circuit and external circuitry.

In accordance with these and other objects of the invention, there is provided a transimpedance amplifier circuit and method in which low frequency signals are rejected and high frequency signals are passed thereby providing high sensitivity. Additionally, the amplifier circuits of the present invention are configured such that the break frequency of the circuits are easily adjustable. All that is required for adjustment of the break frequency is a change to a single circuit element. Additionally, the circuits are designed such that the changeable circuit element is coupled between the amplifier circuit and ground so that only a single interface point need be affected for break frequency changes.

The circuits and method of the present invention utilize a single capacitor coupled between ground and the amplifier circuit to set the break frequency. Additionally, the opamp of previously known transimpedance amplifiers is replaced by a transconductance amplifier which is similar to the first stage of a traditional opamp. The transconductance amplifier supplies an output current, rather than the output voltage of previous circuits, which is generated based on a comparison of $V_{OUT}$ and $V_{BIAS}$ (a predetermined bias voltage).

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Transimpedance amplifier circuits incorporating principles of the present invention are described below. The transimpedance amplifier circuits provide, through a single interface point, the ability to change the break frequency at which the amplifier circuit passes high frequency signals. Additionally, the transimpedance amplifier circuits of the present invention operate such that the high frequency signals are substantially unaffected, thereby providing an amplifier having high sensitivity and wide bandwidth. Thus, the transimpedance amplifier circuits are easily adjustable which enables the circuits to be coupled to multiple output circuits for different operations.

Figure 1:
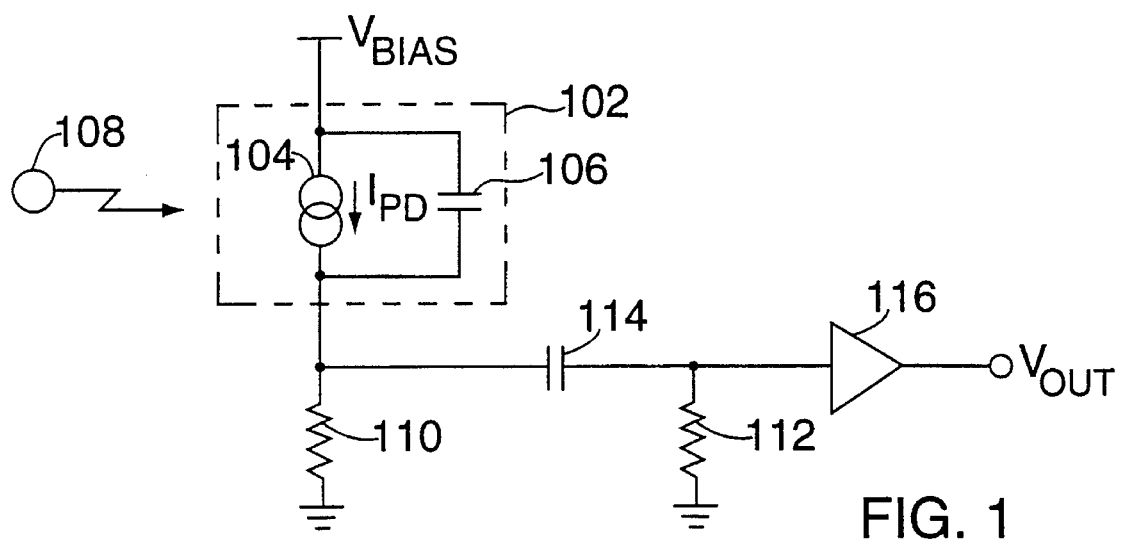
FIG. 1 is a schematic diagram of a conventional current-to-voltage converter circuit.
Figure 2:
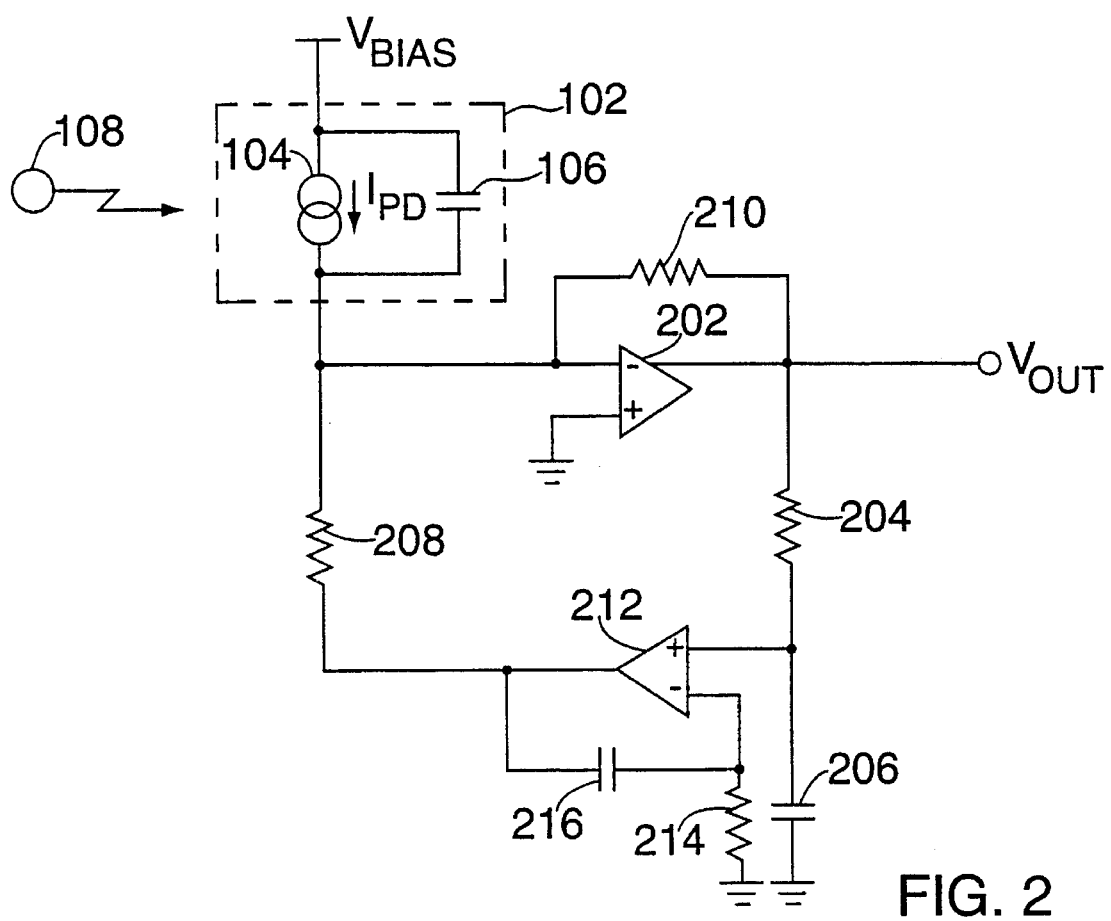
FIG. 2 is a schematic diagram of a conventional transimpedance amplifier circuit.
Figure 3:
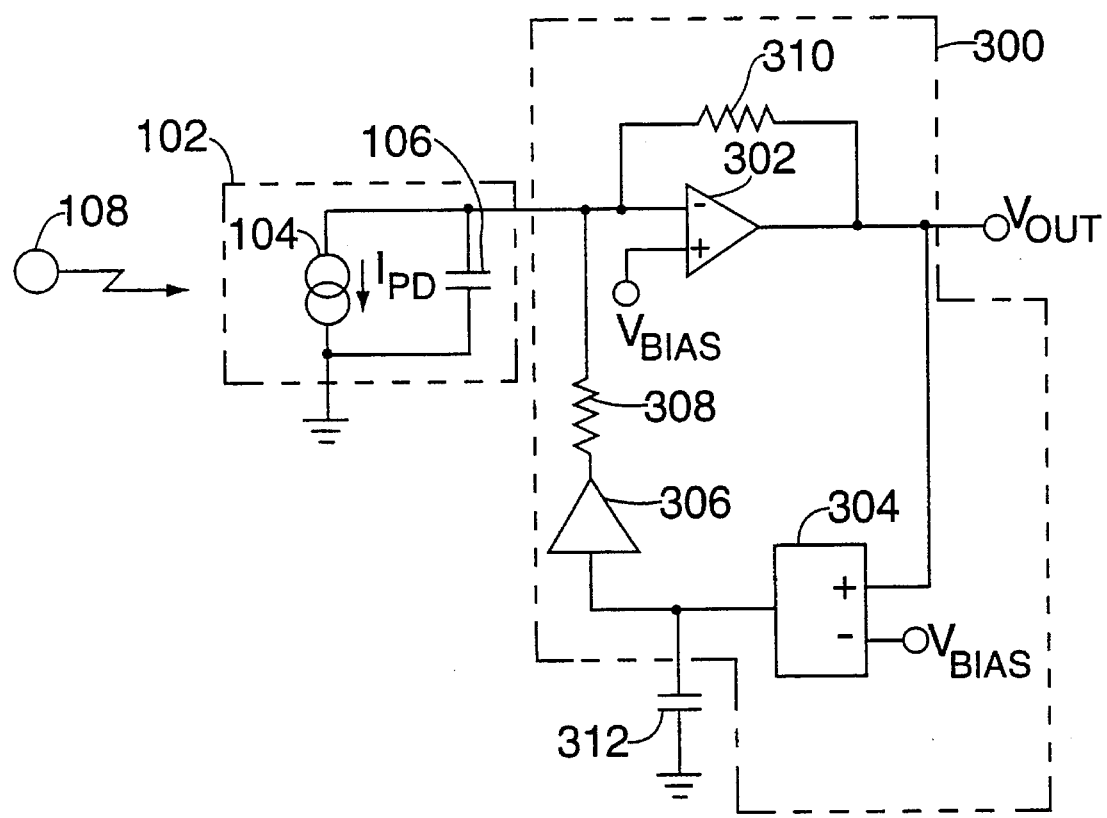
FIG. 3 is a schematic diagram of a transimpedance amplifier circuit in accordance with the principles of the present invention.

Referring to FIG. 3, a transimpedance amplifier 300 constructed in accordance with the principles of the present invention is shown. Transimpedance amplifier 300 includes transimpedance opamp 302, transconductance amplifier 304, unity-gain buffer 306, resistors 308 and 310, and break frequency setting element 312, which is shown in FIG. 3 to be a single capacitor. An AC coupling loop is formed within transimpedance amplifier 300 running from opamp 302, to transconductance amplifier 304, through buffer 306 and resistor 308 back to opamp 302. Break frequency setting element 312 is coupled to the output of transconductance amplifier 304.

A photodiode 102, or other similar current producing device, is coupled to the coupling loop via the inverting input of opamp 302. The non-inverting input of opamp 302 is preferably coupled to a predetermined voltage $V_{BIAS}$, which is also coupled to the inverting input of transconductance amplifier 304. The output of opamp 302 is coupled to the non-inverting input of transconductance amplifier 304.

The AC coupling loop operates as follows. Transconductance amplifier 304 provides an output current to the loop based on a comparison of the output voltage of opamp 302 ($V_{OUT}$) and $V_{BIAS}$. At frequencies below the break frequency, a current is produced which is converted back to a frequency dependent voltage by frequency setting element 312. The resultant voltage is buffered by buffer 306, which drives resistor 308 to provide a correction current to opamp 302. The correction current acts to force the output of opamp 302 back to $V_{BIAS}$. At frequencies above the break frequency, break frequency setting element 312 is essentially a short circuit so that the frequency dependent voltage is substantially zero. Thus, no correction current is produced.

Transimpedance amplifier 300 provides several advantages over previously known current-to-voltage converter circuits. One significant advantage of amplifier 300 is that the overall operation of the circuit is essentially unaffected by break frequency setting element 312, except for the actual setting of the break frequency. This feature of the present invention enables the output of opamp 302 ($V_{OUT}$) to be coupled to more than one output circuit.

An additional feature of the present invention is the ease with which the break frequency may be adjusted. The break setting element 312 is coupled between a single interface point on the AC loop and ground. Thus, the break frequency may be adjusted by merely changing the connection to a single pin on the amplifier chip.

Figure 4:
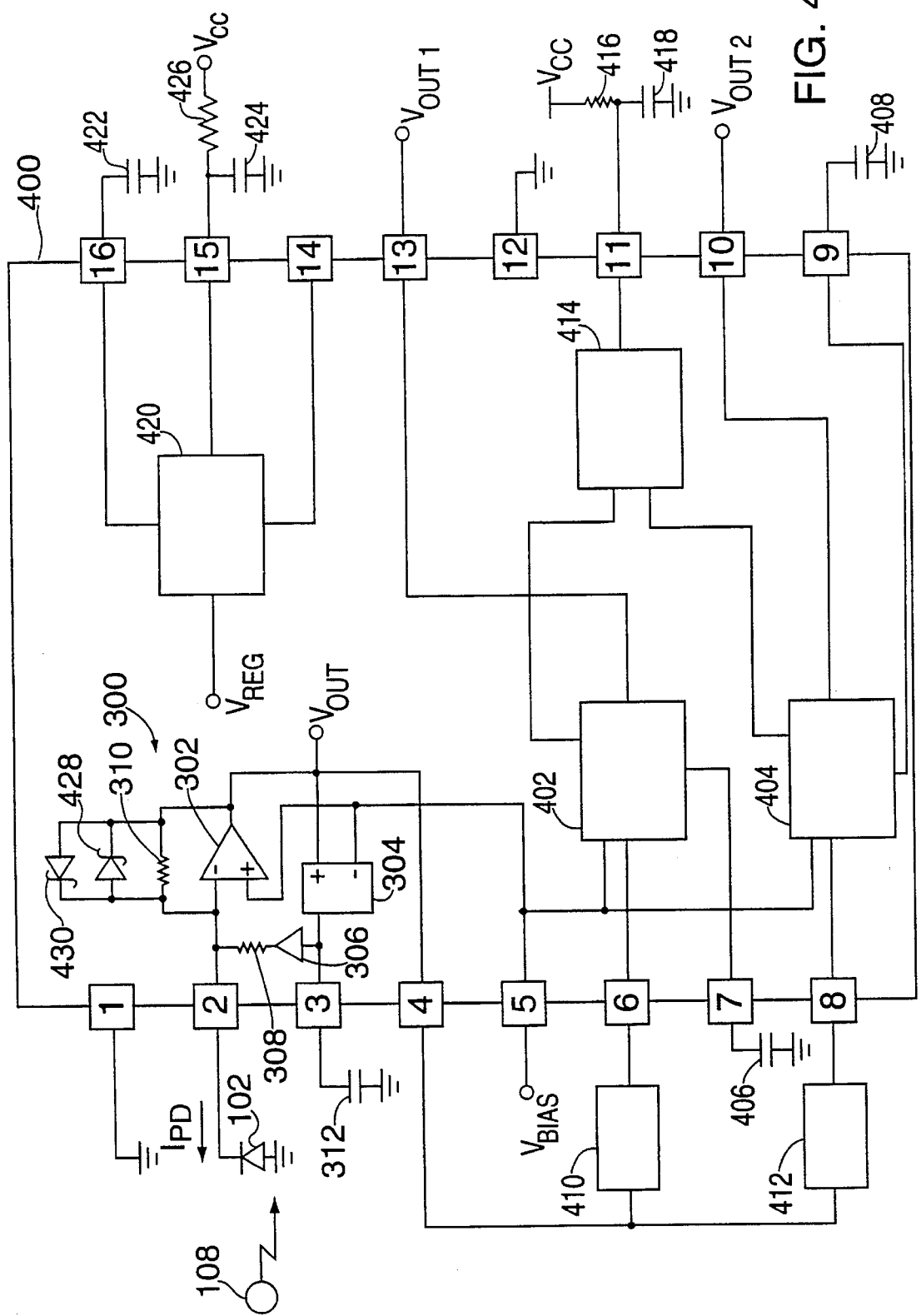
FIG. 4 is a schematic block circuit diagram of a communications circuit which utilizes the transimpedance amplifier of FIG. 3 in accordance with the principles of the present invention.

Both of these features may be more apparent upon an examination of the circuit shown in FIG. 4. FIG. 4 shows a sixteen pin communication chip 400 designed to operate in accordance with two different interface protocols. Each protocol is interpreted by a different one of processing circuits 402 and 404, which are installed within the same chip as transimpedance amplifier 300, to provide two different outputs, $V_{OUT1}$ and $V_{OUT2}$. For example, each of processing circuits 402 and 404 may include a high pass filter (not shown). The break frequencies for the high pass filters may be individually set by capacitors 406 and 408, respectively.

Each of processing circuits 402 and 404 are coupled to $V_{OUT}$ through input circuits 410 and 412, respectively. Additionally, processing circuits 402 and 404 are supplied a threshold voltage by threshold circuit 414. Threshold circuit 414 is coupled to resistor 416 and capacitor 418, which set the operational parameters of threshold circuit 414. It will be apparent to those skilled in the art that other circuit configurations may be used to set the parameters for threshold circuit 414 without departing from the present invention.

Additional circuitry is provided within communications chip 400 to provide a regulated voltage $V_{REG}$ to the circuitry within chip 400. The regulated voltage is controlled by voltage regulator circuit 420, in accordance with connections to external circuitry. For example, in FIG. 4, regulator 420 is coupled to a capacitor 422 at pin 16 which is used to bypass the regulator if desired. Further, the regulated voltage may be set by the circuitry connected to pin 15, namely capacitor 424 and resistor 426. As described above, capacitor 424 and 426 may be replaced with many other configurations by those skilled in the art without departing from the spirit of the present invention. Two additional components, not shown coupled to transimpedance amplifier 300 in FIG. 3 are Schottky diodes 428 and 430, which are optional components that clamp the output for very large signals. If such signals are not a concern, diodes 428 and 430 may be eliminated.

Communication circuit 400 operates as follows. A user connects photodiode 102 or other similar current generating circuitry to pin 2 of chip 400. The break frequency of the AC coupling loop is set by a capacitor 312 coupled to pin 3 of chip 400. Depending on which protocol is selected, a low frequency cutoff is set by either capacitor 406 (coupled to pin 7) or capacitor 408 (coupled to pin 9). The external circuitry is then coupled to the appropriate output (either pin 13 for $V_{OUT1}$ or pin 10 for $V_{OUT2}$). The processing circuit threshold is set by circuitry connected to pin 11 to establish the additional operational parameters of the appropriate processing circuit. Finally, the voltage regulator is set by circuitry attached to pins 15 and 16.

When light from a source 108 is received by photodiode 102, a current $I_{PD}$ is generated at pin 2. The current is input into the AC coupling loop via the inverting terminal of opamp 302. Depending on the frequency of the input signal, the current will either be converted into an output voltage $V_{OUT}$ and output through pin 4, or the AC coupling loop will operate to turn off opamp 302 as described above. The output $V_{OUT}$ is provided through the appropriate input circuit (i.e., either circuit 410 or 412) to the appropriate processing circuit (i.e., circuit 402 or 404) where it is converted into $V_{OUT1}$ or $V_{OUT2}$.

Should the user decide to change the break frequency for the high pass filter, it is only necessary to change element 312 at pin 3. Instead, if the user elects to operate using the second protocol, the external circuitry may be connected to a different one of output pins 10 and 13. In fact, each of pins 10 and 13 may be connected to different external circuitry such that the same photodiode and transimpedance amplifier circuit are used to drive two different output circuits.

Figure 5:
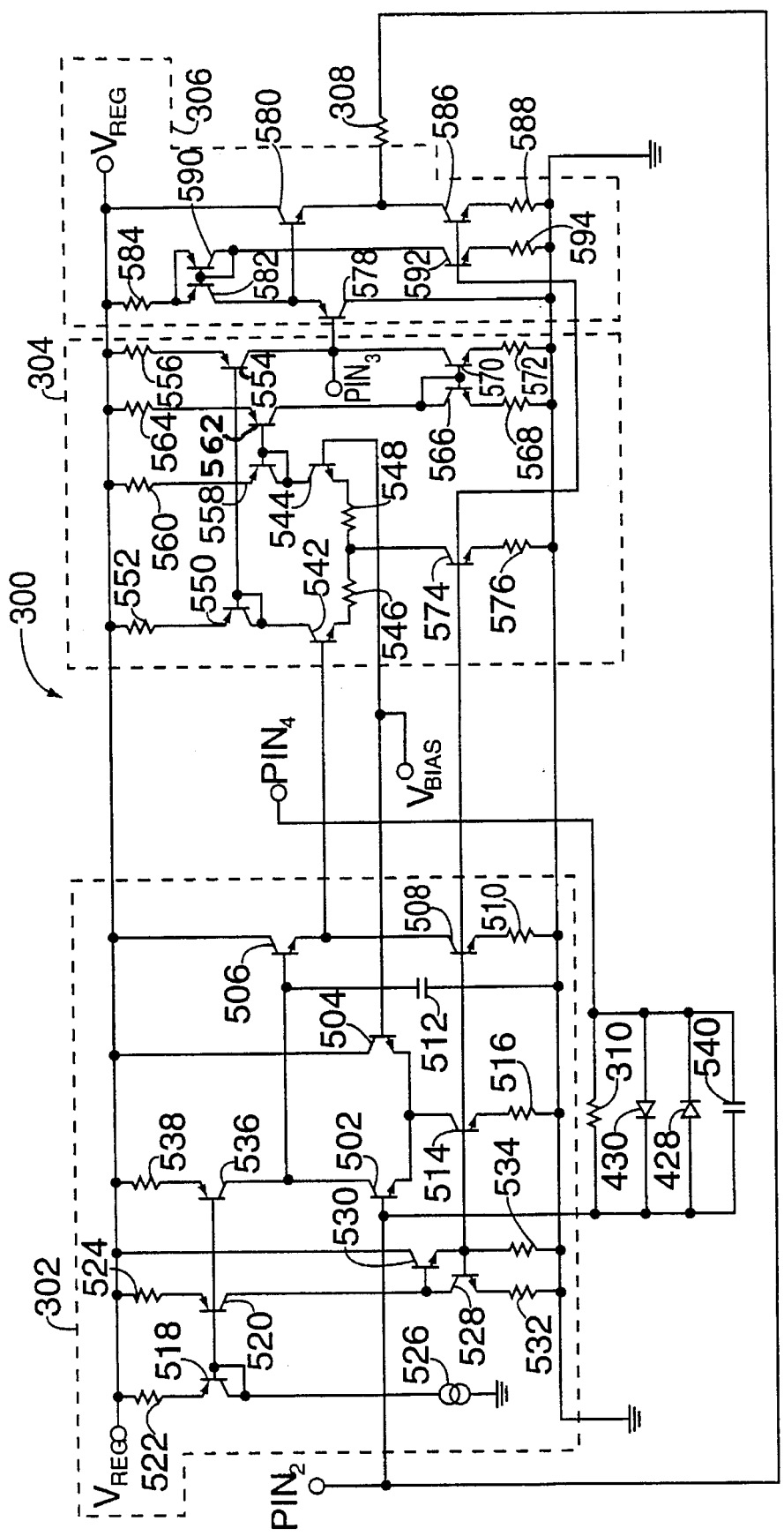
FIG. 5 is a schematic circuit diagram of transimpedance amplifier of FIGS. 3 and 4 in accordance with the principles of the present invention.

A detailed circuit diagram of transimpedance amplifier 300 is provided by FIG. 5. Each of the circuit elements of transimpedance amplifier 300 is shown in detail in FIG. 5, including opamp 302, transconductance amplifier 304, unity buffer 306 and resistors 308 and 310. Additional references to the pins of communication chip 400 of FIG. 4 are consistent with the connections showed to the corresponding pins in FIG. 4. For example, pin 2 in FIG. 5 is for coupling amplifier 300 to a photodiode and pin 3 in FIG. 5 is for coupling amplifier 300 to the break frequency setting element.

The differential pair of transistors 502 and 504 form the inputs to opamp 302, with transistor 502 being the inverting input and transistor 504 being coupled to $V_{BIAS}$. The output of opamp 302 is provided by the emitter of transistor 506, which is biased by the current source formed from transistor 508 and resistor 510. It may be preferable to compensate opamp 302 with capacitor 512, although such compensation is not required. The transistor pair is biased by the current source formed by transistor 514 and resistor 516. Diode-connected transistor 518 and transistor 520, which are coupled together to form a current mirror, are biased by resistors 522 and 524, respectively.

The current mirror pulls a current supplied by current source 526. An additional current source, which is formed by transistors 528 and 530 and resistors 532 and 534, is coupled to bias the current sources which include transistors 508 and 514. The active load for the differential pair is provided by the current source formed by transistor 536 and resistor 538. Additionally, capacitor 540 may be provided to form a low pass filter in combination with resistor 310, however, capacitor 540 is not required for all configurations. The gain of opamp 302, which is provided by transistors 502 and 536, is buffered from the output by transistor 506.

Transconductance amplifier 304 includes a degenerated differential pair formed by transistors 542 and 544 and resistors 546 and 548. The transconductance of amplifier 304 is set by resistors 546 and 548. The inputs of the differential pair are driven by the $V_{OUT}$ and $V_{BIAS}$. Three current mirrors pass the differential current from the differential pair to unity buffer 306.

The first current mirror includes diode-connected transistor 550 and transistor 554, which are degenerated by resistors 552 and 556, respectively. The second current mirror includes diode-connected transistor 558 and transistor 562, which are degenerated by resistors 560 and 564, respectively. And the third current mirror includes diode-connected transistor 566 and transistor 570, which are degenerated by resistors 568 and 572, respectively. The differential pair is biased by the current source formed by transistor 574 and resistor 576. The difference in the collector currents of the differential pair is the input voltage divided by the resistance of resistors 546 and 548. That current is mirrored by the three current mirrors to pin 3, which is coupled to the input of unity buffer 306.

Unity buffer 306 is essentially a voltage follower formed by transistors 578 and 580, which are biased by the current sources of transistors 582 (which is biased by resistor 584)

and 586 (which is biased by resistor 588), respectively. The current flow of transistor 582 is substantially set by diode-connected transistor 590 (which is biased by the current source of transistor 592 and resistor 594), because transistors 582 and 590 are configured as a current mirror in which the collector currents differ in relationship to the emitter areas of transistors 582 and 590. For example, in the circuit of FIG. 5, transistor 582 has an emitter area equal to that of transistor 590.

Thus, the circuit of FIG. 5 is substantially the same as that shown and described above with respect to FIGS. 3 and 4. An input current from a photodiode coupled to pin 2 drives the inverting input of the transimpedance differential pair. The current causes in increase in voltage at the output of opamp 302 due to the gain of transistors 502 and 536. The increased voltage is buffered by transistor 506 and output to pin 4 and the input of transconductance amplifier 304. The voltage is converted to a differential current by the second differential pair, the current being representative of the transimpedance output voltage.

The differential current is mirrored to pin 3 where it is converted to a voltage by the break frequency setting element. The voltage is passed, without gain, to resistor 308 which converts the voltage into a correction current. The correction current is fed back to opamp 302 to force opamp 302 back to $V_{BIAS}$ for input signals at frequencies below the break frequency. At frequencies above the break frequency, pin 3 is effectively shorted which turns off unity buffer 306 so that no correction signal is supplied.

Figure 6:
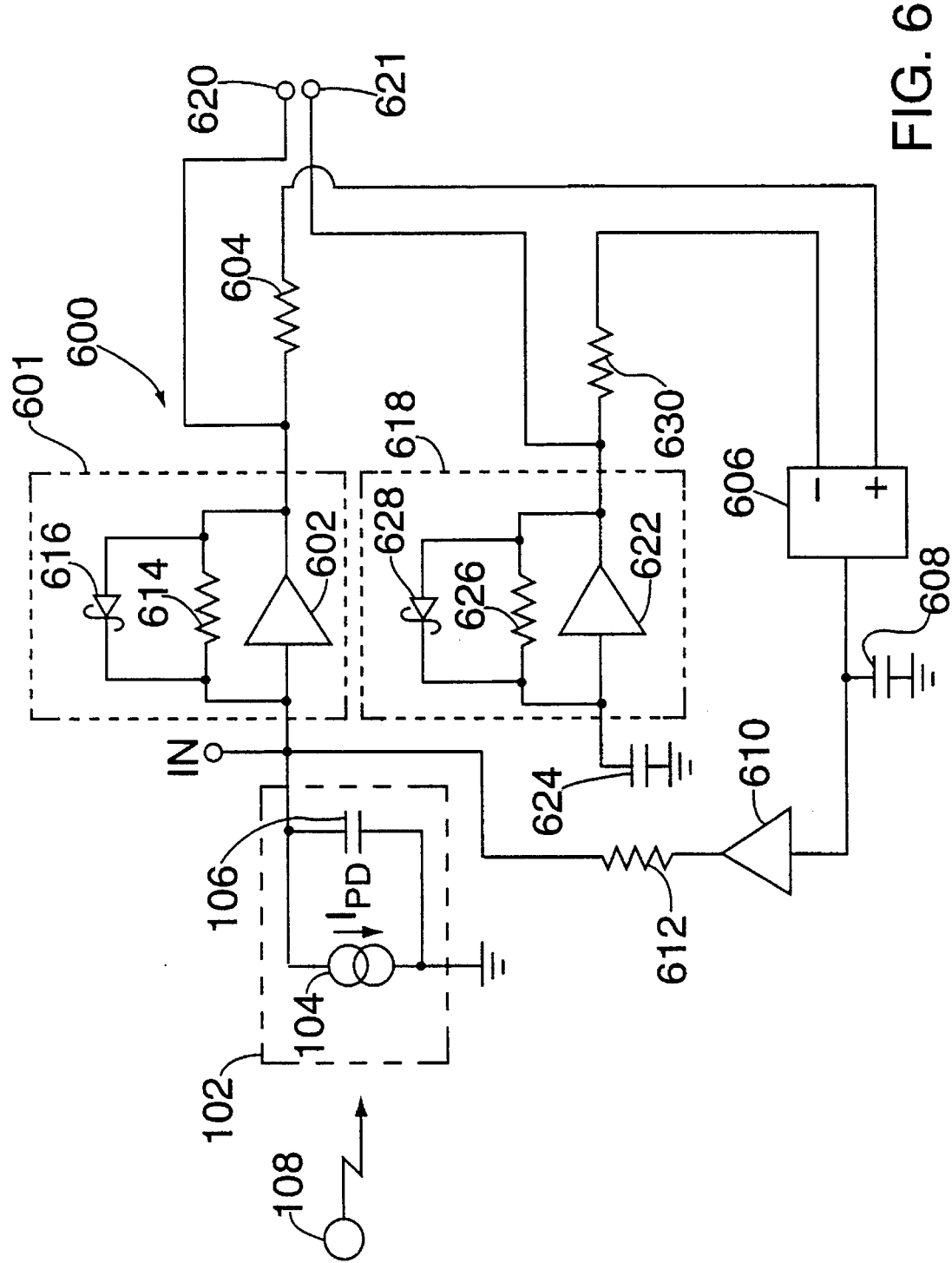
FIG. 6 is a schematic diagram of an alternate embodiment of a transimpedance amplifier circuit constructed in accordance with the principles of the present invention.

An alternate embodiment of a transimpedance amplifier in accordance with the principles of the present invention is shown in FIG. 6. Transimpedance amplifier 600 includes an amplifier 601 which utilizes single-ended gain stage 602 for performing the transimpedance function instead of opamp 302 in amplifier 300.

The output of gain stage 602 passes through resistor 604 to the non-inverting input of transconductance amplifier 606. The output current of amplifier 606 is converted to a voltage by break frequency setting element 608 (shown as a capacitor in FIG. 6). The resultant voltage is passed through unity buffer 610 to resistor 612, which converts it to a correction current that is fed back to gain stage 602. A feedback resistor 614 is coupled in parallel across the input and output of gain stage 602, as is a clamping Schottky diode 616. As described above, Schottky diode 616, which clamps very high signals, may not be needed in all configurations.

Amplifier 600 also includes a dummy amplifier 618 which provides a reference voltage to the inverting input of transconductance amplifier 606. Dummy amplifier 618 includes a single ended gain stage 622 having an input coupled to a capacitor 624 which is equal to the capacitance of photodiode capacitor 106. A feedback resistor 626 and Schottky diode 628 are coupled in parallel across the input and output of gain stage 622. The output of gain stage 622 is coupled to amplifier 606 through a resistor 630. The outputs of gain stages 602 and 622 are also coupled to terminals 620 and 621 for being coupled to a second stage amplifier (as shown in FIG. 7).

It is preferable that amplifiers 601 and 618 include substantially similar components (i.e., gain stages 602 and 622, resistor 604 and 630, and resistors 614 and 626, all have substantially the same values). Amplifier 600 provides better power supply rejection than amplifier 300 because of the use of dummy amplifier 618, however, it also requires an additional pin for connecting photodiode compensation capacitor 624.

Figure 7:
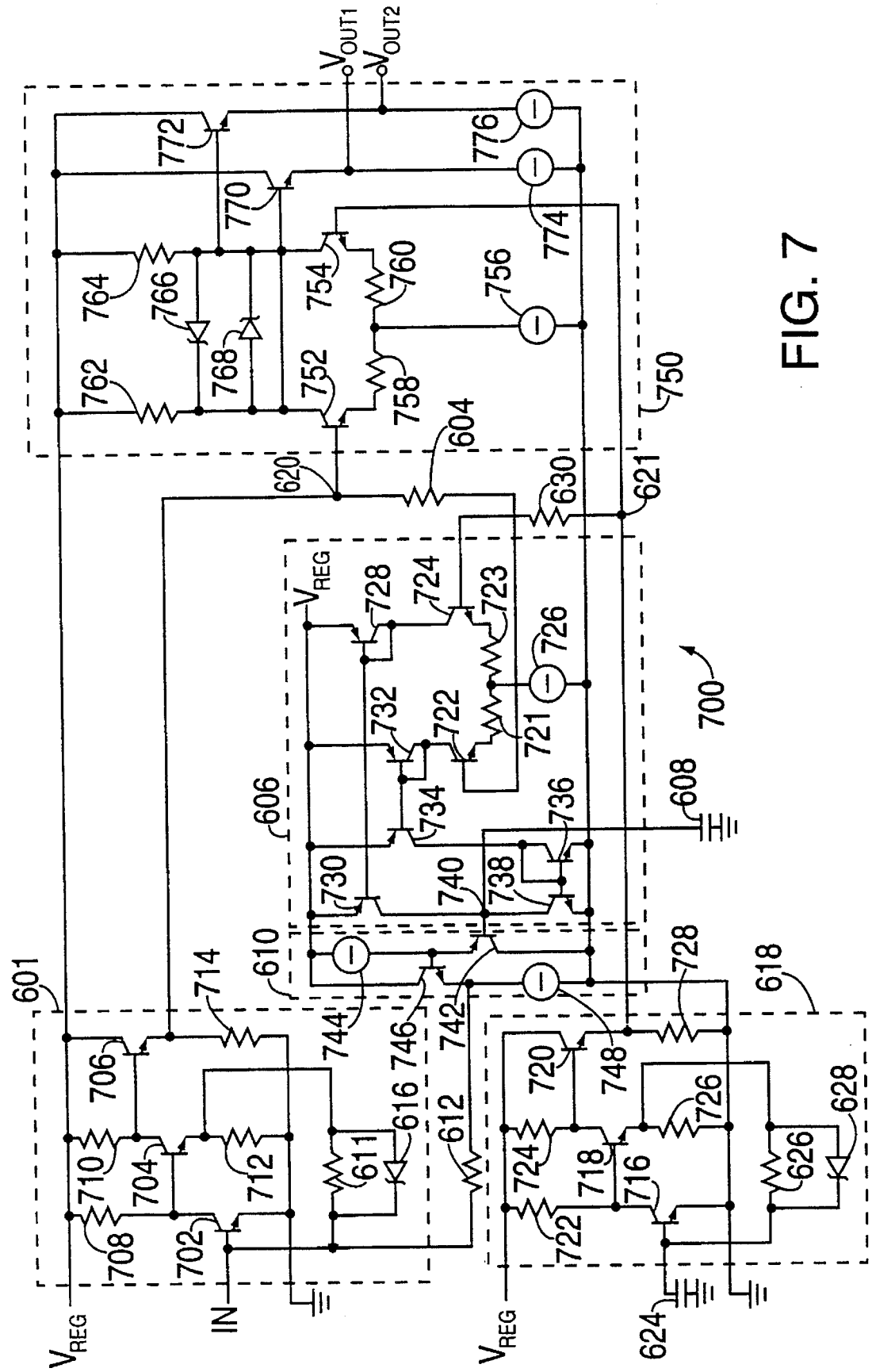
FIG. 7 is a schematic circuit diagram of an alternate embodiment of a transimpedance amplifier which includes the transimpedance amplifier circuit of FIG. 6 constructed in accordance with the principles of the present invention.

FIG. 7 shows a detailed circuit diagram of a transimpedance amplifier 700 which includes transimpedance amplifier 600 of FIG. 6. Transimpedance gain stage 601 includes transistors 702, 704 and 706 which are coupled together in series between pin IN and terminal 620. Biasing of transistors 702, 704, and 706 is accomplished by resistors 708, 710 and 712, and 714, respectively. Transistors 702, 704 and 706 are coupled together such that the input signal drives each transistor in succession so that the output voltage appears at the emitter of transistor 706.

Dummy gain stage 618 is substantially similar to gain stage 601, whereby circuit elements 716–728 correspond to circuit elements 702–714 of gain stage 601, except that transistors 716, 718, and 720 are coupled between compensation capacitor 624 and terminal 621 instead of pin IN and terminal 620.

Transconductance amplifier 606 is configured similarly to transconductance amplifier 304 of FIGS. 3 and 4. Amplifier 606 includes a degenerated differential pair of transistors 722 and 724 which are degenerated by resistors 721 and 723, respectively. Transistors 722 and 724 are biased by current source 726. The transconductance of amplifier 606 is set by resistors 721 and 723. As in amplifier 304, amplifier 606 also includes three current mirrors which are formed by transistor pairs 728/730, 732/734, and 736/738, with transistors 728, 732, and 736 being diode-connected.

The output of transconductance amplifier 606 is a current which is converted to a voltage at node 740 by break frequency setting element 608. The voltage is input to unity buffer 610 through the base of transistor 742, which is biased by current source 744. Transistor 746, which is biased by current source 748, is coupled to transistor 742 to form an emitter follower that provides a voltage to resistor 612. Resistor 612 converts the voltage to a correction current that is fed back to transistor 702.

Transimpedance amplifier 700 also includes a second gain stage 750 which provides a pair of output voltages $V_{OUT1}$ and $V_{OUT2}$. The output from amplifier 601 is input to transistor 752, while the output from amplifier 618 is input to transistor 754. Transistors 752 and 754 are biased by current source 756 and resistors 758, 760, and either resistor 762 or 764 (i.e., transistor 752 is biased by resistor 762). Schottky diodes 766 and 768 clamp high level signals. Each output voltage is buffered by one of transistors 770 and 772 and passed to the appropriate output terminal. Transistors 770 and 772 are biased by current sources 774 and 776, respectively.

Figure 8:
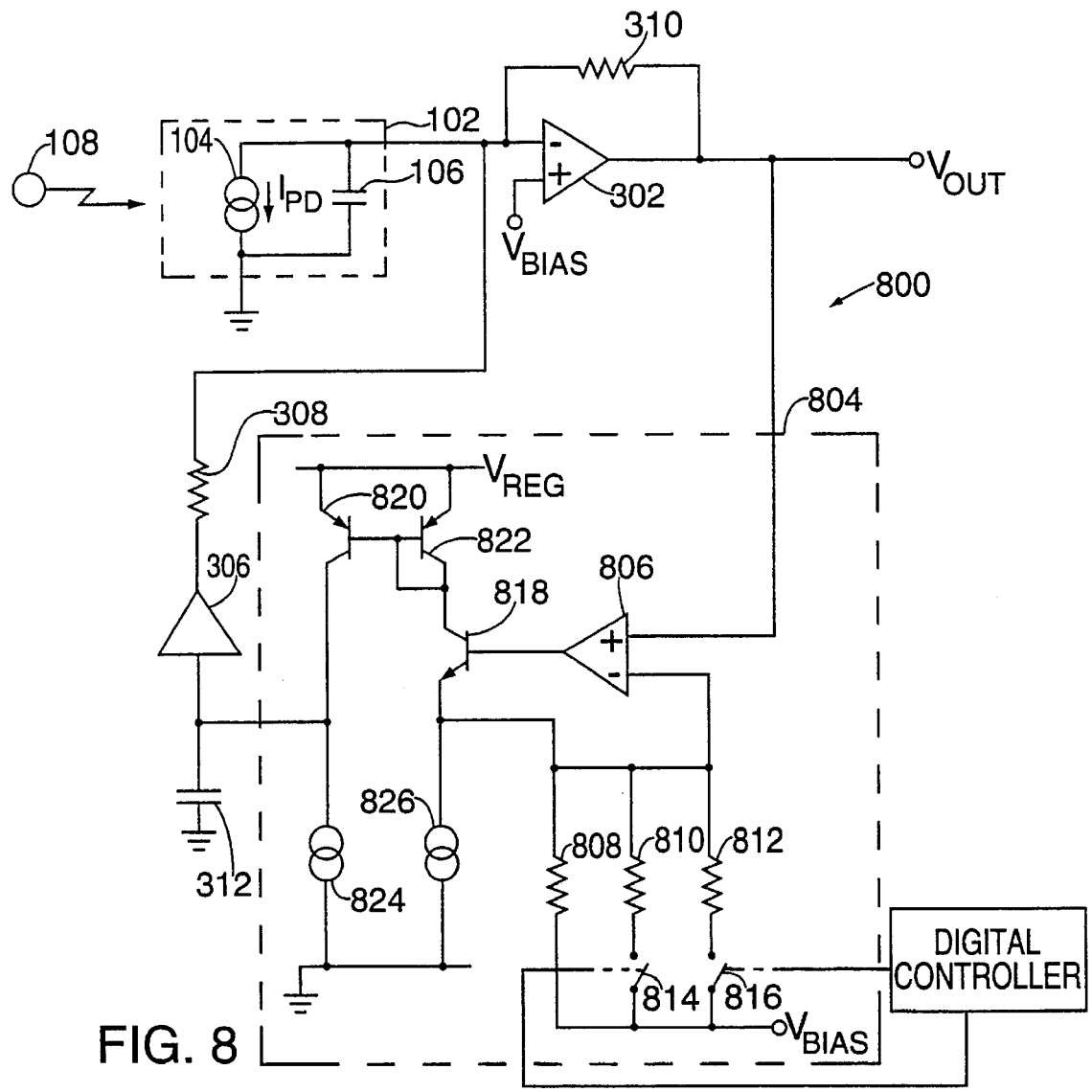
FIG. 8 is a schematic diagram of an alternate embodiment of the transconductance amplifier of the transimpedance amplifier circuit of FIG. 3 constructed in accordance with the principles of the present invention.

An alternate embodiment of the transimpedance amplifier of the present invention is shown in FIG. 8. FIG. 8 includes substantially all of the same components as transimpedance amplifier 300 of FIG. 3. However, instead of transconductance amplifier 304, transimpedance amplifier 800 includes transconductance amplifier 804. One of the advantages of the circuit shown in FIG. 8 is that the transconductance of amplifier 804 can be digitally set by components which are coupled between ground and a reference voltage.

Amplifier 800 includes opamp 806 which has its non-inverting terminal coupled to the output of transimpedance amplifier 302. Unlike transconductance amplifier 304, the voltage which opamp 806 is compared to is set by a combination of resistors 808, 810, and 812. Resistors 810 and 812 are controlled by switches 814 and 816. Additionally, resistors 808, 810 and 812 are coupled such that they also set the value of transconductance of amplifier 804.

For example, in the configuration shown in FIG. 8, the transconductance may be set to any of four different values depending on which, if any, of switches 814 and 816 are closed. These switches may be manually controlled, or they may be coupled to a controller (not shown) which activates the switches based on digital input signals. The output of opamp 806 drives transistor 818 to provide an output current. A current mirror formed by transistor 820 and diode-connected transistor 822 mirrors the output current to the output of amplifier 804. Transistors 820 and 822 are biased by current sources 824 and 826, respectively.

Figure 9:
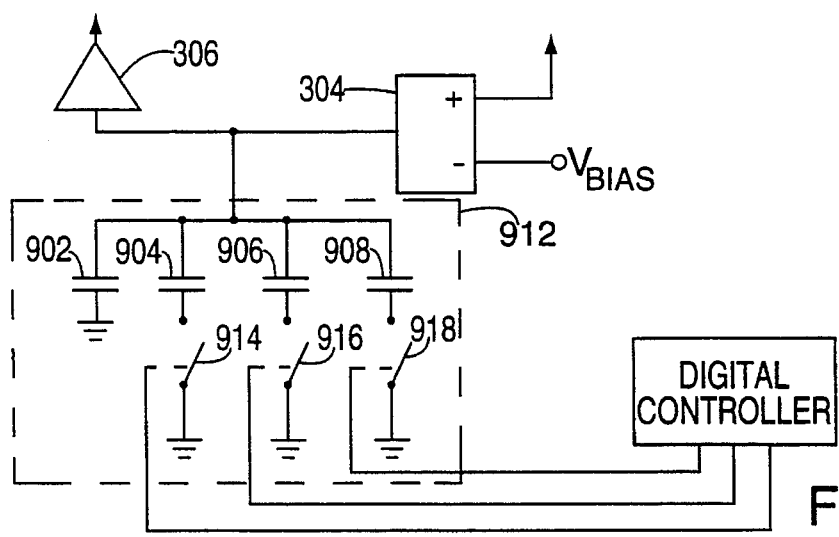
FIG. 9 is a schematic diagram of an alternate embodiment of the break frequency setting circuit of the transimpedance amplifier circuit of FIG. 3 constructed in accordance with the principles of the present invention.

An alternate embodiment of the break frequency setting element of transimpedance amplifier 300 of FIG. 3 is shown in FIG. 9, which is constructed in accordance with the principles of the present invention. For simplicity, only transconductance amplifier 304 and unity buffer 306 of transimpedance amplifier 300 are shown in FIG. 9. It will be apparent to those skilled in the art, that each of the other components of amplifier 300 are also part of the circuit of FIG. 9, except that break frequency setting element 312 has been replaced with break frequency setting network 912.

Break frequency network 912 includes four binary-weighted capacitors 902, 904, 906, and 908, which are all coupled in parallel between the output of amplifier 304 and ground. Additionally, capacitors 904–908 are coupled to ground via switches 914, 916, and 918, respectively. One of the advantages of break frequency network 912 is that the break frequency may be set without changing any circuit elements of transimpedance amplifier circuit 300. Additionally, depending on the number of binary-weighted capacitors used, a wide range of frequencies may be available. For example, network 912 offers eight different break frequencies, where the maximum frequency is set by capacitor 902. Further, if the transconductance amplifier shown in FIG. 8 is also used, the minimum frequency is set by resistor 808.

Persons skilled in the art will thus appreciate that the present invention can be practiced by other than the described embodiments, which are presented for purposes of illustration and not of limitation. For example, even though each of the detailed circuit diagrams shows the use of bipolar junction transistors, other transistors, such as MOSFETs may be used without departing from the spirit of the invention. Additionally, various combinations of the teachings of the present invention are possible without departing from the invention, such as the combination described above with respect to FIG. 9 in which a break frequency setting network is used in combination with the transconductance setting network. Thus, the present invention is limited only by the claims which follow.

What is claimed is:

1. A transimpedance amplifier circuit for converting a current to a voltage at frequencies above one break frequency selected from at least one available break frequency, the amplifier circuit comprising:

a transimpedance circuit coupled between an input terminal and an output terminal, the transimpedance circuit providing an output voltage at the output terminal and having at least one input;

a transconductance circuit coupled to the output terminal, the transconductance circuit providing an output current through an output in response to a comparison of the output voltage and a predetermined reference voltage;

a break frequency setting circuit for setting the one break frequency of the transimpedance amplifier, the break frequency circuit being coupled to a single interface point on the amplifier circuit at the output of the transconductance circuit; and a correction current generation circuit being coupled to the output of the transconductance circuit and to at least one input of the transimpedance circuits the generation circuit providing a correction current that forces the output of the transimpedance circuit to be substantially equal to the predetermined reference voltage at frequencies below the one break frequency.

2. The transimpedance amplifier circuit of claim 1, wherein the break frequency setting circuit comprises a capacitor coupled between a single point of the transimpedance amplifier and ground.

3. The transimpedance amplifier circuit of claim 1, wherein the break frequency setting circuit comprises a binary-weighted capacitor network coupled between the single interface point of the amplifier circuit and ground.

4. The transimpedance amplifier circuit of claim 3, wherein the capacitor network comprises:

a plurality of capacitors coupled in parallel between the single point and ground; and at least one switch coupled in series between at least one of the plurality of capacitors and ground.

5. The transimpedance amplifier circuit of claim 4, wherein the capacitor network is controlled by a digital controller which determines which switches of the at least one switch are closed.

6. The transimpedance amplifier circuit of claim 1 further comprising:

a first output circuit coupled to the output terminal, the first output circuit processing the output voltage in accordance with a first protocol; and a second output circuit coupled to the output terminal, the second output circuit processing the output voltage in accordance with a second protocol.

7. The transimpedance amplifier circuit of claim 1, wherein the transimpedance circuit comprises:

an opamp having an inverting terminal coupled to the input terminal, a non-inverting terminal coupled to a reference voltage, and an output coupled to the output terminal; and a feedback resistor coupled in parallel between the inverting terminal and the output terminal.

8. The transimpedance amplifier circuit of claim 1, wherein the transimpedance circuit comprises:

a single-ended gain stage coupled between the input terminal and the output terminal; and a feedback resistor coupled in parallel with the single-ended gain stage.

9. The transimpedance amplifier circuit of claim 8, further comprising a dummy amplifier coupled to the transconductance circuit, the dummy amplifier producing the predetermined reference voltage.

10. The transimpedance amplifier circuit of claim 1, wherein the transconductance circuit comprises:

an opamp having a non-inverting terminal coupled to the output terminal, an inverting terminal and an output;

a transistor coupled to the output of the opamp, the transistor producing an output current, the transistor having either a collector or an emitter coupled to the inverting terminal of the opamp;

a current mirror circuit coupled to the transistor, the current mirror circuit mirroring the output current from transistor to the output of the transconductance circuit; and a resistor network coupled between the inverting terminal of the opamp and the predetermined reference voltage.

11. The transimpedance amplifier circuit of claim 10, wherein the resistor network comprises:
   a plurality of binary-weighted resistors coupled in parallel between the inverting input of the opamp and the predetermined reference voltage; and
   at least one first switch coupled in series between at least one of the plurality of resistors and the predetermined reference voltage.

12. The transimpedance amplifier circuit of claim 11, wherein the resistor network is controlled by a digital controller which determines which switches of the at least one first switch are closed.

13. The transimpedance amplifier circuit of claim 12, wherein the break frequency setting circuit comprises a binary-weighted capacitor network coupled between the single point of the transimpedance amplifier circuit and ground.

14. The transimpedance amplifier circuit of claim 13, wherein the capacitor network comprises:
   a plurality of capacitors coupled in parallel between the single point and ground; and
   at least one second switch coupled in series between at least one of the plurality of capacitors and ground.

15. The transimpedance amplifier circuit of claim 14, wherein the capacitor network is controlled by the digital controller that determines which switches of the at least one second switch are closed.

16. A communication interface circuit for operating a plurality of interface protocols in response to communication signals, the communication signals being currents, the interface circuit converting the signal currents into signal voltages, the communication interface circuit comprising:
   a transimpedance circuit that receives the signal currents and converts the signal currents into signal voltages at an output terminal;
   a transconductance circuit that receives the signal voltages, the transconductance circuit comparing the signal voltages to a predetermined reference voltage and providing an output current in response to the comparison;
   a break frequency setting circuit for setting one break frequency selected from at least one available break frequency of the communication interface circuit, the setting circuit being coupled to the transconductance circuit to receive the output current;
   a correction current generation circuit coupled in series between the transconductance circuit and the transimpedance circuit, the generation circuit providing a correction current that forces the output of the transimpedance circuit to be substantially equal to the predetermined reference voltage at frequencies below the one break frequency;
   a first protocol interface circuit that receives the signal voltages, the first protocol interface circuit interpreting the signal voltages in accordance with a first protocol; and
   a second protocol interface circuit that receives the signal voltages, the second protocol interface circuit interpreting the signal voltages in accordance with a second protocol.

17. A transimpedance amplifier circuit including an AC coupling loop, the transimpedance amplifier circuit comprising:
   means for converting an input current to an output voltage at an output, the AC coupling loop including the means for converting;
   means for comparing the output voltage to a predetermined reference voltage and for generating a current in response to the comparison, the AC coupling loop including the means for comparing;
   means for setting one break frequency selected from at least one available break frequency of the transimpedance amplifier circuit coupled to a single interface point of the amplifier circuit at the output of the means for comparing; and
   means for producing a correction current at least in response to the current generated by the means for comparing, the AC coupling loop including the means for producing, the correction current forcing the output voltage from the means for converting to be substantially equal to the predetermined reference voltage at frequencies below the one break frequency.

18. The transimpedance amplifier circuit of claim 17, wherein the input current is produced by a photodiode.

19. A method for using a conversion circuit to convert a current to a voltage in response to input signals above one break frequency selected from at least one available break frequency, the method comprising the steps of:
   setting the one break frequency by changing circuitry coupled to a single interface point in the conversion circuit;
   inputting an input current having a given frequency;
   converting the input current to an output voltage;
   comparing the output voltage to a predetermined reference voltage; and
   producing a correction current if the given frequency is below the one break frequency, the correction current causing the step of converting to produce an output voltage substantially equal to the predetermined reference voltage.

20. The method of claim 19, wherein the step of setting comprises placing a capacitor between the single interface point and ground.

21. The method of claim 19, wherein the step of setting comprises the steps of:
   placing a plurality of capacitors, coupled together in parallel, between the single interface point and ground; and
   placing at least one switch between at least one of the plurality of capacitors and ground.

22. The method of claim 19 further comprising the steps of:
   coupling a first output processing circuit to receive the output voltage, the first output processing circuit processing the output voltage in accordance with a first protocol; and
   coupling a second output processing circuit to receive the output voltage, the second output processing circuit processing the output voltage in accordance with a second protocol, the first and second steps of coupling operating independent of each other and independent of the steps of converting, comparing and producing.

* * * * *